(12) United States Patent
Tsuda et al.

(10) Patent No.: US 6,646,900 B2
(45) Date of Patent: Nov. 11, 2003

(54) TERNARY CONTENT ADDRESSABLE MEMORY WITH DATA AND MASK DATA SETTABLE THEREWITHIN BY ONE WRITE CYCLE

(75) Inventors: Tomoo Tsuda, Chiba (JP); Ryuichi Hata, Chiba (JP)

(73) Assignee: Kawasaki Microelectronics, Inc., Chiba (JP)

(*) Notice: Subject to any disclaimer, the term of this patent is extended or adjusted under 35 U.S.C. 154(b) by 0 days.

(21) Appl. No.: 10/279,838

(22) Filed: Oct. 25, 2002

(65) Prior Publication Data

US 2003/0081442 A1 May 1, 2003

(30) Foreign Application Priority Data

Oct. 31, 2001 (JP) ........................................ 2001-334121

(51) Int. Cl.[7] .................................................. G11C 7/00
(52) U.S. Cl. ..................................... 365/49; 365/189.07
(58) Field of Search ............................. 365/49, 189.07, 365/189.01, 190

(56) References Cited

U.S. PATENT DOCUMENTS

| | | | |
|---|---|---|---|
| 5,319,589 A | * | 6/1994 | Yamagata et al. ............ 365/49 |
| 5,319,590 A | | 6/1994 | Montoye |
| 5,642,114 A | * | 6/1997 | Komoto et al. ............... 365/49 |
| 6,108,227 A | | 8/2000 | Voelkel |
| 6,154,384 A | | 11/2000 | Nataraj et al. |

FOREIGN PATENT DOCUMENTS

JP        A 7-220483        8/1995

* cited by examiner

*Primary Examiner*—Thong Le
(74) *Attorney, Agent, or Firm*—Oliff & Berridge, PLC

(57) ABSTRACT

A ternary content addressable memory device is disclosed which writes data into a data cell and writes mask data into a mask data cell in a ternary CAM cell unit by a single write cycle when the ternary content addressable memory device is used as a binary content addressable memory device. The content addressable memory device includes at least the ternary content addressable memory cell unit which stores ternary data representing three states of "0", "1", and "don't care". The ternary content addressable memory cell unit include the data cell for storing binary data of "0" and "1", and the mask cell for storing mask data for masking the binary data from a searching operation. The content addressable memory device includes a write circuit which writes the binary data into the data cell while writing the mask data in an unmask state into the mask cell at the same time, when the binary data is written into the ternary content addressable memory cell unit.

19 Claims, 7 Drawing Sheets

| TERNARY DATA | DATA 1 (D1) | DATA 2 (D2) | D1N, D2 |
|---|---|---|---|
| 0 | 0 | 0 | 1, 0 |
| 1 | 1 | 1 | 0, 1 |
| DON'T CARE | 1 | 0 | 0, 0 |
| INVALID | 0 | 1 | 1, 1 |

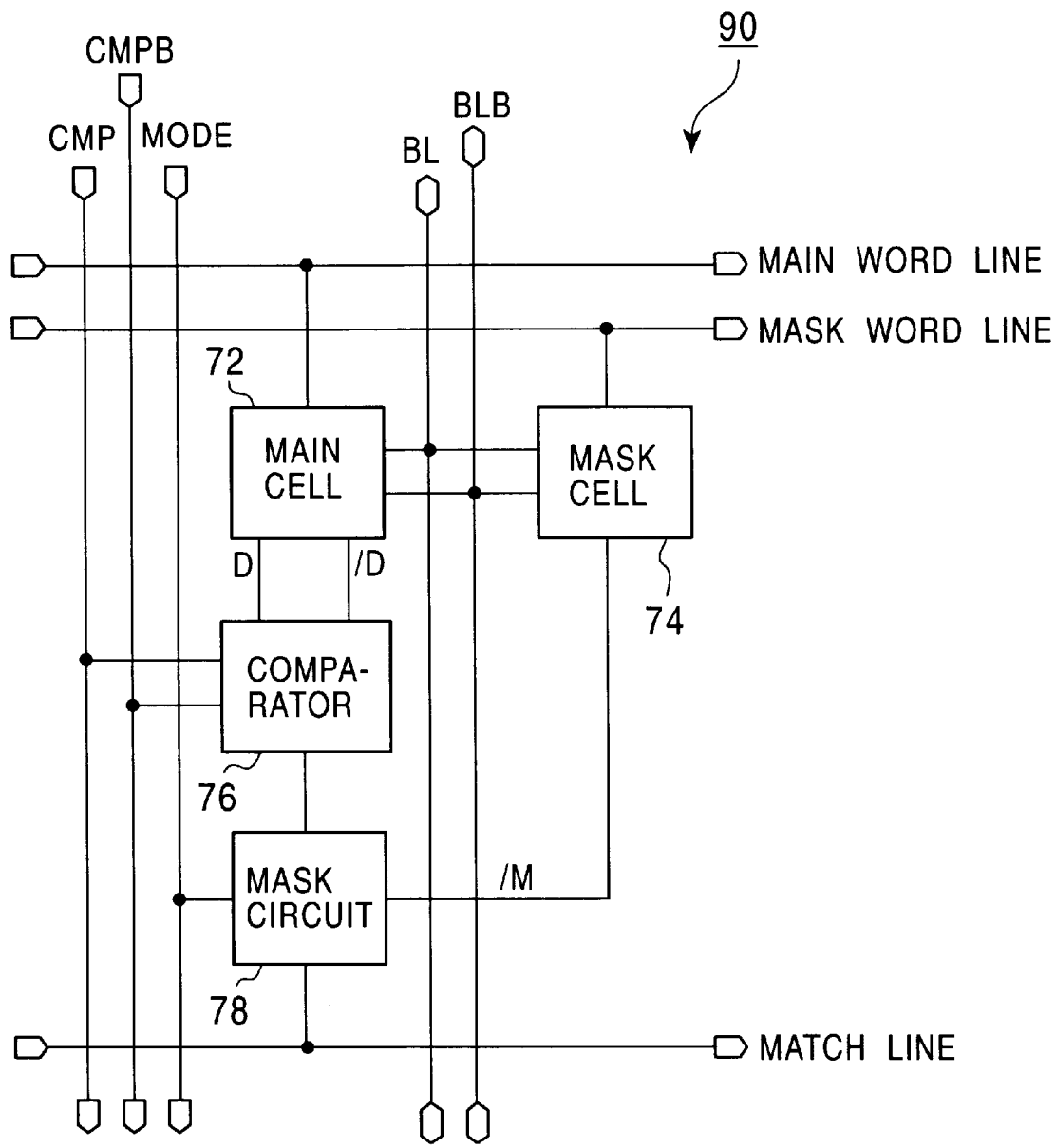

TERNARY CONTENT ADDRESSABLE MEMORY WITH DATA AND MASK DATA SETTABLE THEREWITHIN BY ONE WRITE CYCLE

BACKGROUND OF THE INVENTION

1. Field of the Invention

The present invention relates to a content addressable memory device (hereinafter referred to CAM) for storing ternary data. Particularly, the present invention relates to a CAM which writes data onto a data cell and a mask cell by a single write cycle when a ternary CAM cell is used as a binary CAM cell.

2. Description of the Related Art

With the wide-spread use of the Internet, a high-speed requirement is increasing on network relay devices, such as a switching hub and a router. To meet a high-speed requirement, the relay device frequently uses a CAM for address filtering and classification of packets.

Specifically, CAMs are used in a search process in layers 2, 3, and 4 of the OSI (Open System Interconnection) of a network. Conventional binary CAMs having "0" and "1" are sufficient in some search processes, but ternary CAMs having "don't care" in addition to "0" and "1" are needed in other search processes.

The ternary CAMs are disclosed in U.S. Pat. No. 6,154,384 and Japanese Patent Application Publication No. 7-220483, for example.

According to U.S. Pat. No. 6,154,384 as shown in FIG. 8, a ternary CAM cell unit 70 includes a main cell 72 for storing data, a mask cell 74 for storing mask data, a comparator 76 for comparing data held in the main cell 72 with search data supplied through a pair of search (comparison) data lines CMP and CMPB, a mask circuit 78 for controlling whether or not to output the result of the comparison of the comparator 76 to a match line in response to a logical state of mask data held in the mask cell 74, and a precharge circuit 80 for precharging the match line.

A pair of complementary data bit lines BL and BLB, supplied with data to be stored in the main cell 72 and data to be stored in the mask cell 74, are connected to each of the main cell 72 and the mask cell 74. A main word line for selecting the main cell 72 is connected to the main cell 72. A mask word line for selecting the mask cell 74 is connected to the mask cell 74.

When mask data indicating an unmask state is stored in the mask cell 74 in the ternary CAM cell unit 70, the result of the comparison of the comparator 76 is output to the match line the same as in the conventional binary CAM. When mask data indicating a mask state is set in the mask cell 74, the comparator 76 is electrically isolated from the match line by the mask circuit 78, and the match line remains in a match state. In other words, the match line is at a "don't care" state.

According to Japanese Patent Application Publication No. 7-220483 shown in FIG. 9, a ternary CAM cell unit 82 includes two memory cells 84 and 86 for storing two bit data, and a match detector circuit 88. A pair of bit lines BL1 and BL1/ are connected to the one memory cell 84, and a pair of bit lines BL2 and BL2/ are connected to the other memory cell 86. One word line W is commonly connected to the two memory cells 84 and 86.

In the ternary CAM cell unit 82, the "don't care" state is assigned to two bit data "0,0" stored in the two memory cells 84 and 86, the "0" state is assigned to the two bit data of "0,1" and the "1" state is assigned to two bit data of "1,0".

When "0" or "1" is stored in the two memory cells 84 and 86 as the ternary data, the match detector circuit 88 compares the ternary data of "0" or "1" with search data. The result of the comparison is output to the match line (not shown) as a signal MV. Specifically, when a match is detected, the signal MV (a voltage at the match line) holds the precharged "1" state. When an unmatch is detected, the match line is discharged to "0".

When the "don't care" state is stored as the ternary data, the match detector circuit 88 is electrically isolated from the match line, and the signal MV remains precharged at "1", namely, the match state is maintained.

When the ternary CAM cell units 70 and 82 are used as a binary CAM cell, the ternary CAM cell unit 70 shown in FIG. 8 must store the binary data in the main cell 72 and the mask data in the unmask state in the mask cell 74. The ternary CAM cell unit 82 shown in FIG. 9 must store "0,1" or "1,0" in the two memory cells 84 and 86. In comparison with conventional binary CAM, the number of settings of data is doubled.

U.S. Pat. No. 6,108,227 proposes another ternary CAM cell.

Referring to FIG. 10, a ternary CAM cell unit 90 has a mode in which a comparator 76 outputs the result of the comparison to the match line in response to a signal MODE regardless of the state of the mask data, in addition to the ternary CAM cell unit 70 shown in FIG. 8. When the ternary CAM cell unit 90 is used as a binary CAM cell, it suffices to store data in the main cell 72. In other words, the ternary CAM cell unit 90 is used as a binary CAM cell by a single write operation.

However, this ternary CAM cell unit 90 requires the mask circuit 78 which outputs, to the match line, the result of the comparison of the comparator 76 regardless of the state of the mask data in response to the signal MODE. As the result, the area of the CAM cell increases inebitably.

The requirement for a larger capacity on the CAM is mounting, and an increase in the cell area is a serious problem. There is a need for a ternary CAM cell which requires no redundant write cycle of mask data when used as a binary CAM cell and is free from an increase in the cell area.

SUMMARY OF THE INVENTION

Accordingly, it is an object of the present invention to provide a content addressable memory device which allows a ternary CAM cell to be used as a binary CAM cell by a single write cycle without requiring an increase in the scale of a circuit.

In one aspect of the present invention, a content addressable memory device incudes at least one ternary content addressable memory cell unit which stores one of ternary data of "0", "1", and "don't care" states, wherein the ternary content addressable memory cell unit includes a data cell for storing binary data of "0" and "1" and a mask cell for storing mask data that masks the binary data from a searching operation, and a write circuit which writes the binary data to the data cell while writing the mask data in an unmask state to the mask cell at the same time when the binary data is written to the ternary content addressable memory cell unit.

Preferably, the content addressable memory device includes at least one ternary content addressable memory cell unit which stores one of ternary data of "0", "1", and "don't care" states, wherein the ternary content addressable memory cell unit includes a data cell for storing data supplied through a data bit line, and a mask cell for storing mask data that is supplied through a mask bit line and masks the content addressable memory cell unit from a searching operation, and a comparator which compares the data stored in the data cell with search data, and outputs the result of the comparison if the mask data in the unmask state is stored in the mask cell, and outputs a match as the result of the comparison if the mask data in a mask state is stored in the mask cell.

When the ternary data is written into the ternary content addressable memory cell unit, the mask data is written into the mask cell independently of the writing of the data into the data cell. On the contrary, when the binary data is written into the ternary content addressable memory cell unit, the mask data in an unmask state is written into the mask cell while the data is written into the data cell at the same time.

The content addressable memory device includes a write circuit. The write circuit preferably includes a first write driver which supplies the data bit line with the data to be stored in the data cell, and a second write driver which supplies the mask bit line with the mask data to be stored in the mask cell. Each of the data cell and the mask cell preferably is of a static random-access memory type, and each of the data bit line, and the mask bit line preferably is a complementary bit line pair.

In another aspect of the present invention, a content addressable memory device includes at least one ternary content addressable memory cell unit for storing ternary data, wherein the ternary content addressable memory cell unit includes a first data cell for storing first data, and a second data cell for storing second data, a comparator which compares ternary data of "1", "0", and "don't care", assigned by the first and second data, with search data, and outputs the result of the comparison if the ternary data is "1" or "0", or always outputs a match if the ternary data is "don't care". When binary data is written into the ternary content addressable memory cell unit, the same data is written to the first data cell and the second data cell.

When the ternary data is written on the ternary content addressable memory cell unit, the second data is preferably written to the second data cell independently of the writing of the first data to the first data cell.

Preferably, the ternary data of one of "0" and "1" is assigned to the first and second data of "0,0", the ternary data of the other of "0" and "1" is assigned to the first and second data of "1,1", and the ternary data of "don't care" is assigned to one of the first and second data of "0,1" and "1,0".

Preferably, the ternary content addressable memory cell unit further includes a first data bit line which is connected to the first data cell, and is supplied with the first data to be stored in the first data cell, a second data bit line which is connected to the second data cell and is supplied with the second data to be stored in the second data cell, and a word line which is connected to the first data cell and the second data cell, and concurrently selects the first and second data cells.

Preferably, each of the data cell and the mask cell is of a static random-access memory type, and each of the data bit line and the mask bit line is a complementary bit line pair.

The ternary content addressable memory device includes a write circuit. The write circuit preferably includes a write driver for supplying data, a first column gate which supplies the first data bit line pair with the data supplied by the write driver as the first data, and a second column gate which supplies the second data bit line pair with the data supplied by the write driver as the second data.

Preferably, the ternary content addressable memory cell unit further includes a first word line for selecting the first data cell, connected to the first data cell, a second word line for selecting the second data cell, connected to the second data cell, and a data bit line connected to the first data cell and the second data cell, and supplied with data to be stored in the first data cell and the second data cell. When the content addressable memory cell is of a SRAM type, the common data bit line is preferably a complementary bit line pair.

BRIEF DESCRIPTION OF THE DRAWINGS

FIG. 10 illustrates yet another conventional ternary CAM cell unit.

DESCRIPTION OF THE PREFERRED EMBODIMENTS

A content addressable memory device of the present invention is described with reference to the drawings.

Figure 1:
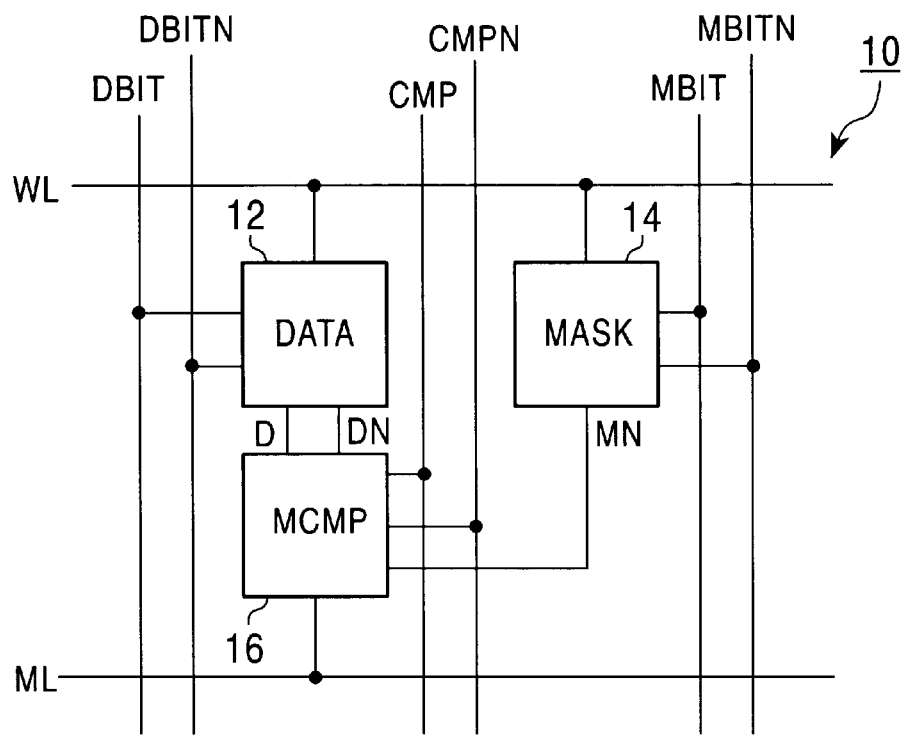
FIG. 1 illustrates the concept of one embodiment of a CAM cell unit of the present invention.

FIG. 1 illustrates the concept of one embodiment of a CAM cell unit of the present invention.

As shown, a CAM cell unit 10 is a ternary CAM cell that can be set one of the three states of "0", "1", and "don't care". The CAM cell unit 10 includes a data cell (DATA) 12 and a mask cell (MASK) 14, and a maskable comparator (MCMP) 16. Each of the data cell 12 and the mask cell 14 is formed a SRAM type memory cell.

Referring to FIG. 1, there is shown a one bit cell (one bit as a ternary CAM, actually two bits). There is no limitation to the number of bits in the CAM device of the present invention. In other words, one word may be formed of a CAM cell unit or more. There is no particular limitation to the number of words.

In the CAM cell unit 10, the data cell 12 stores one bit data to be searched for. Connected to the data cell 12 are a pair of complementary data bit lines DBIT and DBITN for writing data to the data cell 12 or for reading data from the data cell 12, and a word line WL for selecting the data cell 12 and for controlling reading and writing of the data.

The mask cell 14 stores one bit mask data for masking the CAM cell unit from a search operation. Connected to the mask cell 14 are a pair of complementary mask bit lines MBIT and MBITN for writing the mask data to the mask cell 14, and the word line WL for controlling the reading and writing of the mask data (this word line WL is shared by the data cell 12).

The data cell 12 and the mask cell 14 may have any circuit arrangement as long as they hold one bit data and the mask data, respectively. A memory cell having any known construction may be used.

The comparator 16 compares data supplied through a pair of complementary data lines D and DN with search data supplied through a pair of complementary search lines CMP and CMPN, and outputs the result of the comparison to a match line ML in accordance with the state of an inverted signal MN of the mask data stored in the mask cell 14.

In this embodiment, when the inverted signal MN is "0", in other words, when the mask data is "1", the data held by the data cell 12 is masked (to the "don't care" state), and the comparator 16 always outputs a match. When the mask data is "0", the result of the comparison of the data held in the data cell 12 with the search data is output to the match line ML.

The comparator 16 is specifically described below with reference to FIGS. 2A and 2B.

Figure 2A:
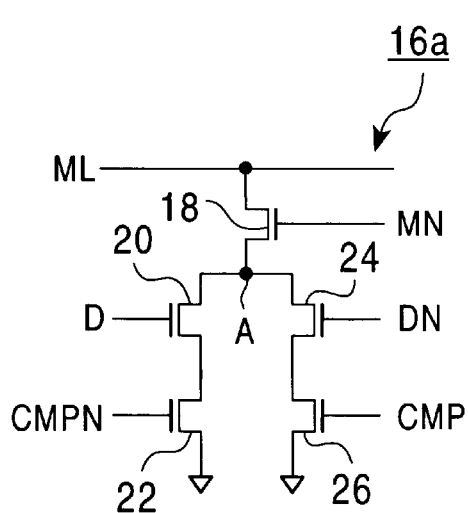
FIGS. 2A and 2B are circuit diagrams of a comparator in the CAM cell unit of FIG. 1.

Referring to FIG. 2A, a comparator 16a includes five N type MOS transistors (hereinafter referred to as NMOS transistors) 18, 20, 22, 24, and 26.

An NMOS 18 is connected between the match line ML and a node A, and receives the inverted signal MN of the mask data at the gate thereof. NMOS transistors 20 and 22 are connected in series between the node A and the ground with the gates thereof respectively connected to the data line D and the search data line CMPN. Likewise, NMOS transistors 24 and 26 are connected in series between the node A and the ground with the gates thereof respectively connected to the data line DN and the comparison data line CMP.

In the comparator 16a shown in FIG. 2A, the match line ML is precharged to a level "1" by a precharge circuit (not shown) prior to the start of a search.

A search is now performed. The NMOS 18 remains off when the inverted signal MN of the mask data is "0". The comparator 16a is electrically isolated from the match line ML regardless of the state at the pair of data lines D and DN, and the state of the pair of search data lines CMP and CMPN. In other words, the data of the data cell 12 is masked (to the "don't care" state), and the match line ML remains at a precharged level "1".

The inverted signal MN of the mask data is now at "1". When both the data line D and the inverted search data CMPN are at "1", or both the inverted data DN and the search data CMP are at "1", in other words, when the data held in the data cell 12 fails to match the search data, the match line is discharged to a ground potential "0" through the conductive NMOS transistors 18, 20, and 22, or conductive NMOS transistors 18, 24, and 26. At other times, the match line ML maintains a level "1".

Figure 2B:
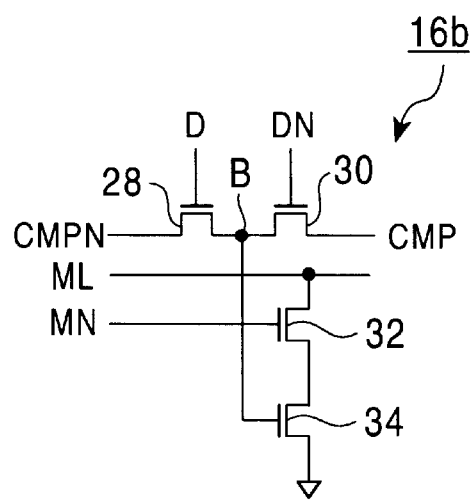

Referring to FIG. 2B, a comparator 16b includes four NMOS transistors 28, 30, 32, and 34.

The NMOS transistors 28 and 30 are connected in series between the search lines CMPN and CMP and respectively receive the data D and the inverted data DN at the gates thereof. The NMOS transistors 32 and 34 are connected in series between the match line ML and the ground. The NMOS transistor 32 receives the inverted signal MN at the gate thereof, and the NMOS transistor 34 is configured with the gate thereof connected to a node B.

In the comparator 16b shown in FIG. 2B, the NMOS transistor 32 continuously remains off when the inverted signal MN is at "0". The comparator 16b is electrically isolated from the match line ML. In other words, the data held in the data cell 12 is masked (to the "don't care" state). In this embodiment, the match line ML maintains a precharged "1" state.

The inverted signal MN is now at "1". When both the data D and the inverted search data CMPN are "1", or when the inverted data DN and the search data CMP are at "1", in other words, when the data held in the data cell 12 fails to match the search data, the match line ML is discharged to a ground potential "0" through the conductive NMOS transistors 32 and 34. At other times, the match line ML maintains the "1" state.

The comparator 16 has been specifically described. The circuit arrangement of the present invention is not limited to the above circuits. Any known circuit may be employed.

Figure 3:
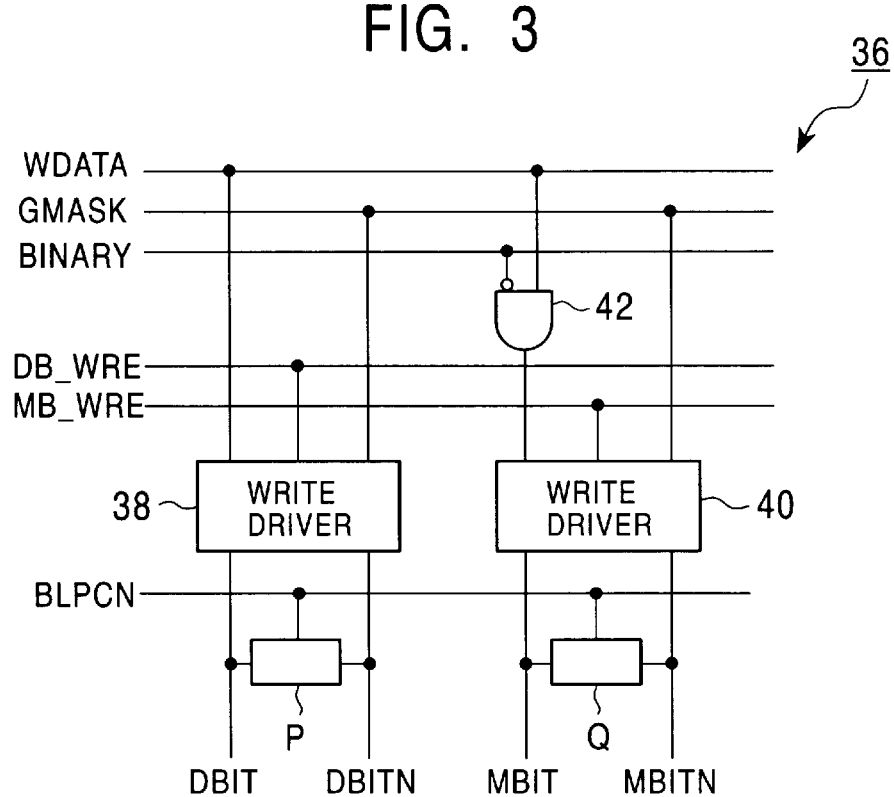
FIG. 3 illustrates one embodiment of a write driver used in the CAM cell unit of FIG. 1.

Referring to FIG. 3, a driver for supplying the CAM cell unit illustrated in FIG. 1 with the data and the mask data is described below.

The write circuit 36 illustrated in FIG. 3 includes write drivers 38 and 40 respectively for the data cell and the mask cell, an AND gate 42, and precharge circuits P and Q.

In the write circuit 36, the write driver 38 feeds the data and the inverted version thereof to be written to the data cell 12 through a pair of data bit lines DBIT and DBITN. Connected to the write driver 38 are a write data line WDATA to which the data to be written to the data cell 12 is fed, a global mask line GMASK, and a data write enable line DB_WRE.

The write driver 40 feeds the mask data and the inverted version thereof to be written to the mask cell 14 to a pair of mask bit lines MBIT and MBITN. Connected to the write driver 40 are the output of the AND gate 42, the global mask line GMASK, and the data write enable line DB_WRE. Two input lines, namely, a line WDATA and a line BINARY are connected to the AND gate 42.

The global mask line GMASK controls whether or not to inhibit the writing of data to the data cell 12, and the writing of the mask data to the mask cell 14. When the global mask line GMASK is at a level "1", the write drivers 38 and 40 feed "1" to all of the pair of data bit lines DBIT and DBITN, and the pair of mask bit lines MBIT and MBITN to inhibit writing.

A signal BINARY indicates whether the data to be written to the data cell 12 is binary or ternary. In this embodiment, the data to be written to the data cell 12 is binary when the signal BINARY is at "1", and is ternary when the signal BINARY is at "0".

The operation of the write circuit 36 with the global mask line GMASK at "1" has been described. When the global mask line GMASK is at "0", in other words, the writing is permitted, the write driver 38 feeds the signal WDATA and the inverted version thereof to the pair of data bit lines DBIT and DBITN while the signal DB_WRE is at "1".

For the period of time when the signal DB_WRE is at "0", the pair of data bit lines DBIT and DBITN are not driven by the write driver 38 but are precharged to a level "1" by the precharge circuit P.

When the signal BINARY is at "1", in other words, when binary data is written, the output of the AND gate 42 remains at "0" regardless of the level of the signal WDATA. The write driver 40 feeds "0" and "1" to the pair of mask bit lines MBIT and MBITN for the period of time when the signal MB_WRE is at "1".

When the signal BINARY is at "0", in other words, when ternary data is written, the output of the AND gate 42 remains identical to the signal WDATA. The write driver 40 respectively feeds the signal WDATA and the inverted version thereof to the pair of mask bit lines MBIT and MBITN for the period of time when the signal MB_WRE is at "1".

For the period of time when the signal MB_WRE is at "0", the pair of mask bit lines MBIT and MBITN are not driven by the write driver 40 and but are precharged to a level "1" by the precharge circuit Q.

The circuit arrangement of the write circuit 36 is not limited to the one shown here. Another circuit performing the same function may be used, and may have another construction as long as the write circuit have the same function.

The operation of the CAM cell unit 10 of the present invention illustrated in FIGS. 1 and 2A and 2B with the global mask line GMASK at "0" is described below.

To write the binary data, or to use the CAM cell unit 10 as a binary CAM cell unit, the signal BINARY is set to "1", and the data to be written to the data cell 12 is fed to the write data line WDATA.

The signal DB_WRE is set to "1", and the write driver 38 feeds the signal WDATA and the inverted version thereof to the pair of data bit lines DBIT and DBITN, respectively. Concurrently, the signal MB_WRE is set to "1". The write driver 40 drives the pair of mask bit lines MBIT and MBITN to "0" and "1", respectively.

The word line WL is set to "1". The data applied to the pair of data bit lines DBIT and DBITN is written to the data cell 12. Concurrently, the mask data applied to the pair of mask bit lines MBIT and MBITN, namely, "0" is written to the mask cell 14. The mask cell 14 is set to an unmask state (to a not "don't care" state) concurrently when the data is written to the data cell 12.

A single write cycle causes the CAM cell unit 10 of this embodiment to be used as a conventional binary CAM cell unit.

When the ternary data is written, in other words, when the CAM cell unit 10 is used as a ternary CAM cell unit, the signal BINARY is set to "0", and the data to be written to the data cell 12 is fed to the write data line WDATA.

The signal DB_WRE is set to "1". The write driver 38 applies the signal WDATA and the inverted version thereof to the pair of data bit lines DBIT and DBITN, respectively. The pair of mask bit lines MBIT and MBITN are then not driven and are precharged to "1" by the precharge circuit Q.

The word line WL is transitioned to "1". The data applied to the pair of data bit lines DBIT and DBITN is written to the data cell 12. The pair of mask bit lines MBIT and MBITN are at a high-impedance state, and the potential of one of the lines gradually drops by the mask cell 14. But, the mask data held in the mask cell 14 remains unchanged. The operation of writing the mask data to the mask cell 14 is basically similar except the points that the signal DB_WRE is exchanged by the signal MB_WRE, and the pair of data bit lines DBIT and DBITN is exchanged by the pair of mask bit lines MBIT and MBITN.

The another embodiment of the CAM cell of the present invention is described below.

Figure 4:
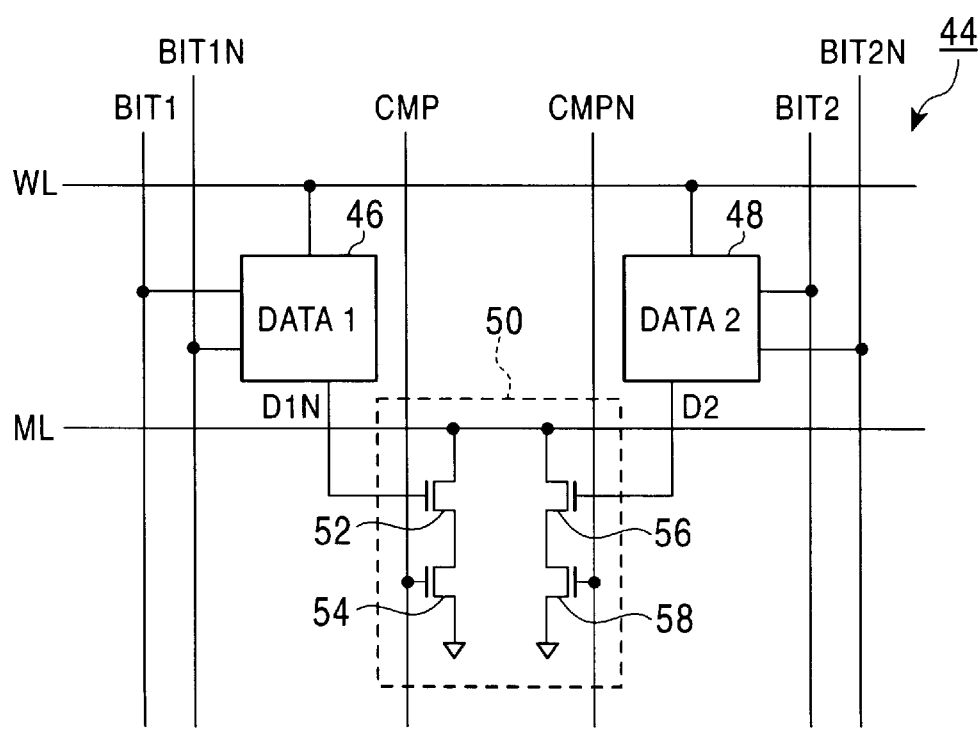
FIG. 4 illustrates another embodiment of the CAM cell unit of the present invention.

FIG. 4 illustrates another embodiment of the CAM cell of the present invention. As shown, for convenience of explanation, a ternary CAM cell unit for one bit (as a ternary CAM) is included in a CAM cell unit 44. The CAM cell unit 44 here includes two data cells 46 and 48, and a comparator 50.

A pair of bit lines BIT1 and BIT1N are connected to the data cell 46, and a pair of bit lines BIT2 and BIT2N are connected to the data cell 48. The same word line WL is connected to the data cells 46 and 48. In other words, the two data cells 46 and 48 have respective bit line pairs connected thereto and share the same word line WL connected thereto.

In the CAM cell unit 44, two bit data 1 and 2 (D1 and D2) stored in the data cells 46 and 48 are assigned to each of the states of the ternary data of "1", "0", and "don't care". In accordance with this embodiment as listed in FIG. 5, the data 1 and data 2 of "0,0" are assigned to the "0" of the ternary data, the data 1 and data 2 of "1,1" are assigned to "1" of the ternary data, the data 1 and data 2 of "1,0" are assigned to "don't care" of the ternary data. The data 1 and data 2 of "0,1" are invalid.

The assignment between the data stored in the data cells 46 and 48 and the ternary data is not limited to this example. Alternatively, the data 1 and data 2 of "0,0" are assigned to one of the ternary data of "0" and "1", and the data 1 and data 2 of "1,1" are assigned to the other of the ternary data of "0" and "1".

The comparator 50 includes four NMOS transistors 52, 54, 56, and 58. The NMOS transistors 52 and 54 are connected in series between a match line ML and the ground, and receive an inverted data D1N from the data cell 46 and search data CMP at the respective gates thereof. The NMOS transistors 56 and 58 are connected in series between the match line ML and the ground, and receive data D2 from the data cell 48 and inverted search data CMPN at the respective gates thereof.

The comparator 50 compares the search data supplied through the pair of lines CMP and CMPN with the ternary data of "1", "0", and "don't care" assigned to the data held in the data cells 46 and 48, and outputs the result of the comparison to the match line ML.

Figures 5, 6:
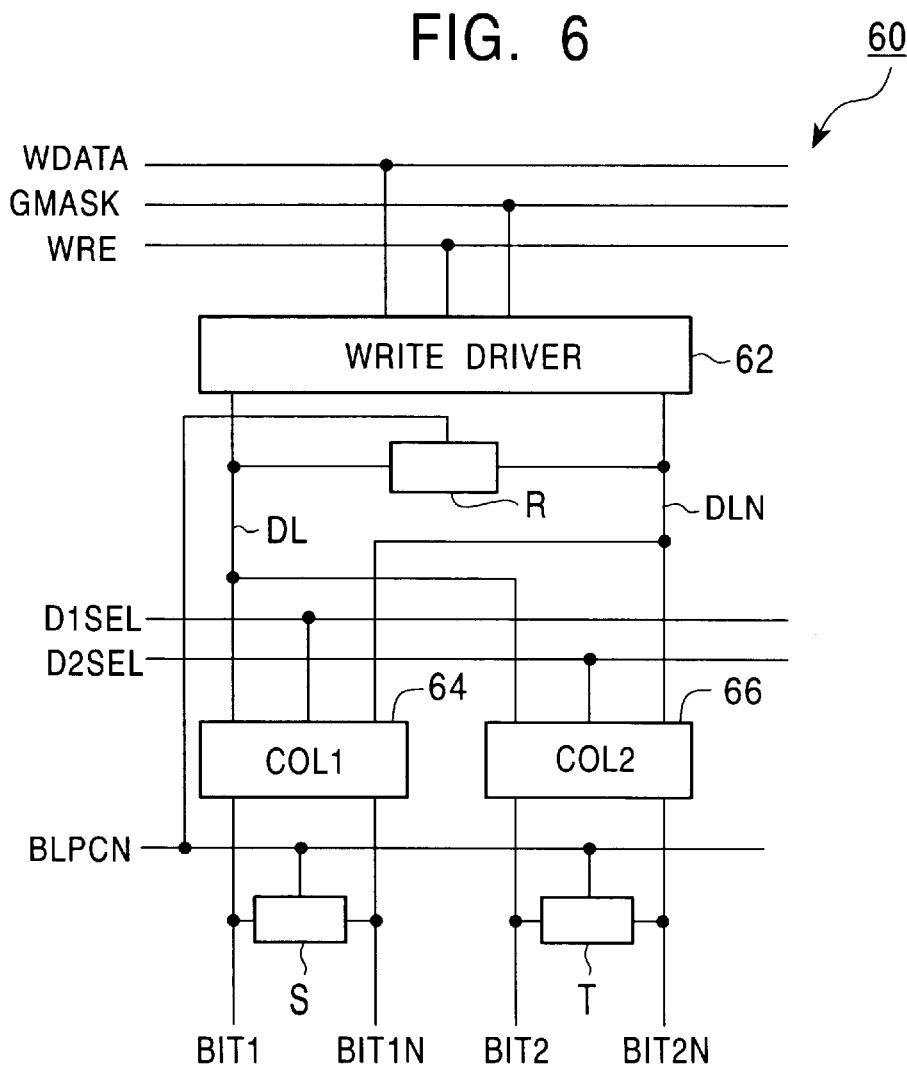
FIG. 5 is a table showing the relationship between the setting of two data cells in the CAM cell unit in FIG. 4 and ternary data of the ternary CAM.
FIG. 6 illustrates one embodiment of a write driver used in the CAM cell unit of FIG. 4.

When "0" is held as the ternary data, the inverted data D1N is "1", and the data D2 is "0" as listed in a reference table in FIG. 5. If the search data of "0", namely, "0,1" are fed to the pair of lines CMP and CMPN, the NMOS transistors 52 and 56 are respectively turned on and off, and the NMOS transistors 54 and 58 are turned off and on. A match is thus detected, and the match line ML maintains a precharged "1" state.

If the search data is "1", namely, the pair of lines CMP and CMPN are supplied with "1,0", the NMOS transistors 54 and 58 are respectively turned on and off. The match line ML is discharged to a level "0" through the NMOS transistors 52 and 54. An unmatch is detected. When the ternary data of "1" is held, the CAM cell unit 44 operates in a similar fashion.

If the ternary data of "don't care" is held, the inverted data D1N and the data D2 are both "0" in the reference table shown in FIG. 5. Regardless of whether the search data is "0" or "1", the NMOS transistors 52 and 56 remain off. The match line ML is kept to the precharged "1" state. In other words, a match is always detected as the result of the comparison.

A write circuit 60 of the CAM cell unit 44 shown in FIG. 4 is described with reference to FIG. 6.

The write circuit 60 shown in FIG. 6 includes a write driver 62, column gates (COL1 and COL2) 64 and 66 respectively for the data cells 46 and 48, and precharge circuits R, S, and T.

Connected to the write driver 62 are a write data line WDATA, a global mask line GMASK, and a write enable line WRE.

The operation of the write driver 62 in the write circuit 60 remains identical to that of the write drivers 38 and 40 illustrated in FIG. 3. When the global mask line GMASK is at "1", a pair of write data lines DL and DLN are both driven to "1" by the precharge circuit R. When the global mask line GMASK is at "0", the pair of the write data lines DL and DLN are respectively supplied with the signal WDATA and the inverted version thereof during the period of time when the signal WRE is at "1".

For the period of time throughout which the signal WRE is "0", the pair of write data lines DL and DLN are not driven by the write driver 62, but remains precharged at "1" by the precharge circuit R.

The column gates 64 and 66 respectively drive a pair of data bit lines BIT1 and BIT1N and a pair of data bit lines BIT2 and BIT2N. Connected to the column gate 64 are a selection signal line D1SEL, and a pair of data lines DL and DLN extending from the write driver 62. Connected to the column gate 66 are a selection signal line D2SEL, and the pair of data lines DL and DLN.

The column gate 64 outputs, to the pair of data bit lines BIT1 and BIT1N, the signal supplied to the pair of data lines DL and DLN for the period of time when the selection signal D1SEL is supplied. The column gate 66 operates in the same way.

The circuit arrangement of the write circuit 60 is not limited to the one described above. A different circuit arrangement is acceptable as long as the circuit has the same function. The write driver 62, and the column gates 64 and 66 are not limited to any particular circuit arrangements. Any circuit arrangement is acceptable as long as the circuit has the same function.

When the binary data is written, the data to be written is applied to the write data line WDATA.

The signal WRE is set to "1", and the write driver 62 supplies the pair of data lines DL and DLN with the signal WDATA and the inverted version thereof. The selection signal D1SEL and the selection signal D2SEL are concurrently driven to "1", and the pair of data bit lines BIT1 and BIT1N are supplied with the signal WDATA and the inverted version thereof. The pair of data bit lines BIT2 and BIT2N are also supplied with the signal WDATA and the inverted version thereof.

The word line WL is driven to "1". The data fed to the pair of data bit lines BIT1 and BIT1N is written to the data cell 46. Concurrently, the data fed to the pair of data bit lines BIT2 and BIT2N is written to the data cell 48. The data cells 46 and 48 are set to "0,0" when the signal WDATA is at "0", and are set to "1,1" when the data cells 46 and 48 are set to "1".

A single write cycle causes the CAM cell unit 44 of this embodiment shown in FIG. 4 to be used as a conventional binary CAM cell unit.

To write ternary data, the data to be written to the data cell 46 is applied to the write data line WDATA.

The signal WRE is set to "1". The write driver 62 supplies the pair of data lines DL and DLN with the signal WDATA and the inverted version thereof.

The selection signal D1SEL only is set to "1". The pair of data bit lines BIT1 and BIT1N are supplied with the signal WDATA and the inverted version thereof. The pair of data bit lines BIT2 and BIT2N are then not driven but remain precharged at a level "1" by the precharge circuit T.

Thereafter, the word line WL is set to "1". The data fed to the pair of data bit lines BIT1 and BIT1N is written to the data cell 46. The pair of data bit lines BIT2 and BIT2N are at a high-impedance state, and the potential of one of the lines gradually drops by the data cell 48. But, the data held in the data cell 48 remains unchanged. The operation of writing the data to the data cell 48 is basically similar to the operation of writing the data to the data cell 46.

The CAM cell unit of another embodiment of the present invention will be described.

Figure 7:
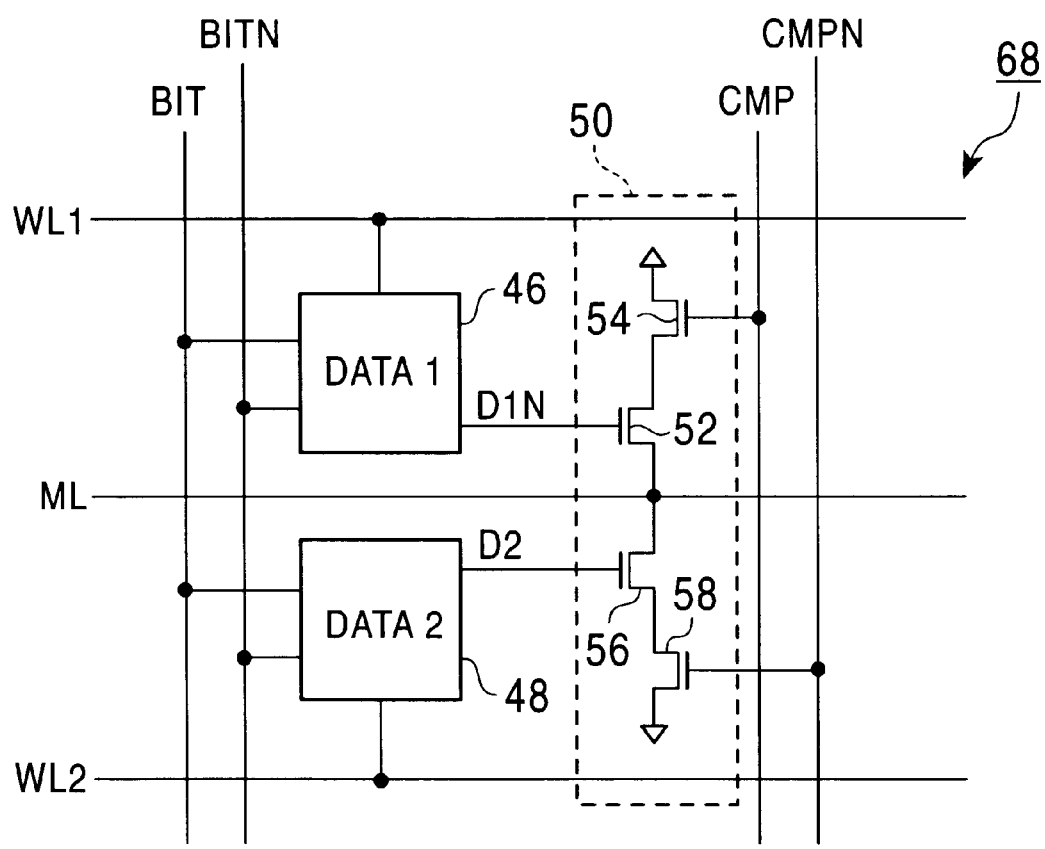
FIG. 7 illustrates another embodiment of the CAM cell unit of the present invention.
Figure 8:
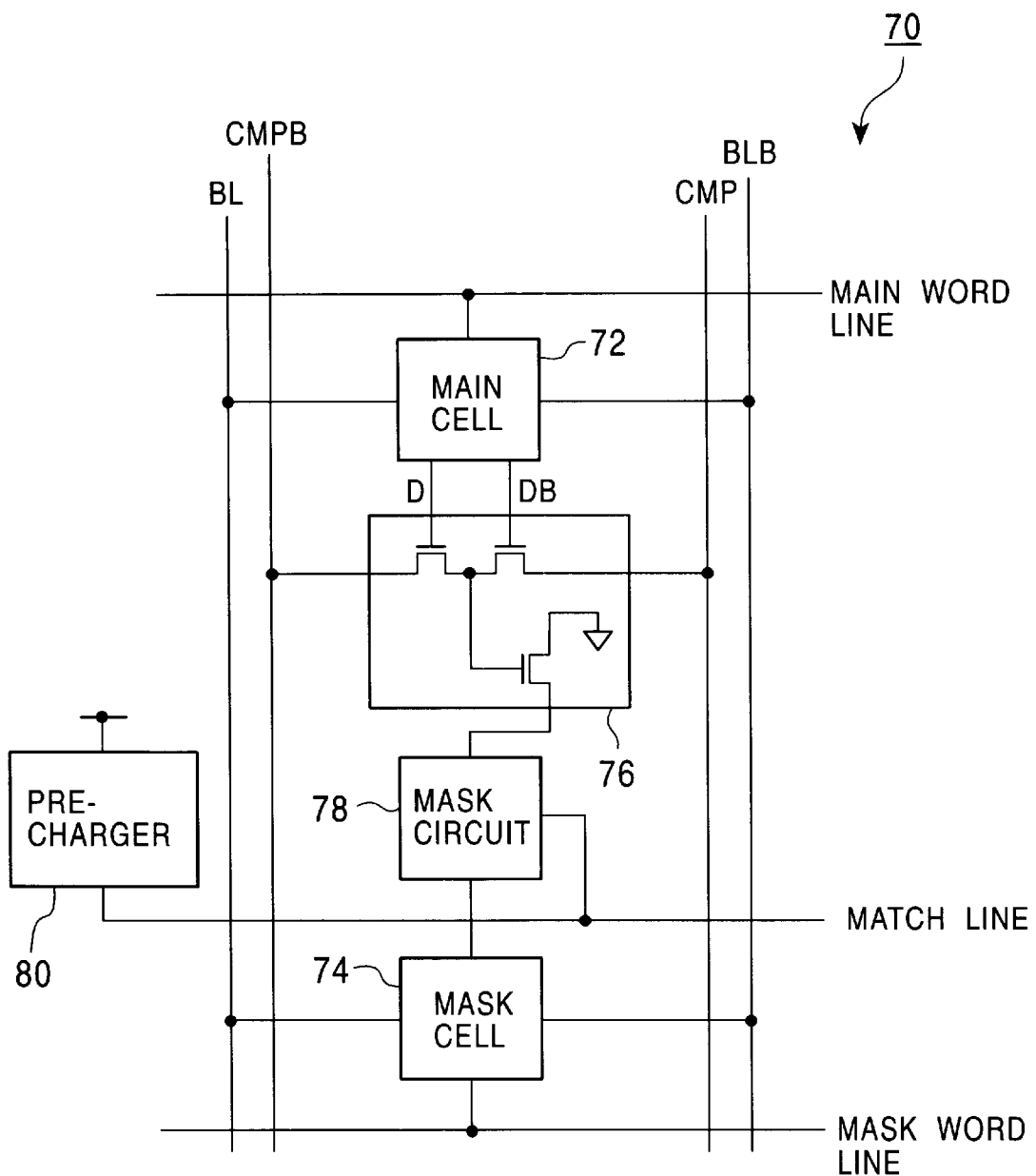
FIG. 8 illustrates a conventional ternary CAM cell.
Figure 9:
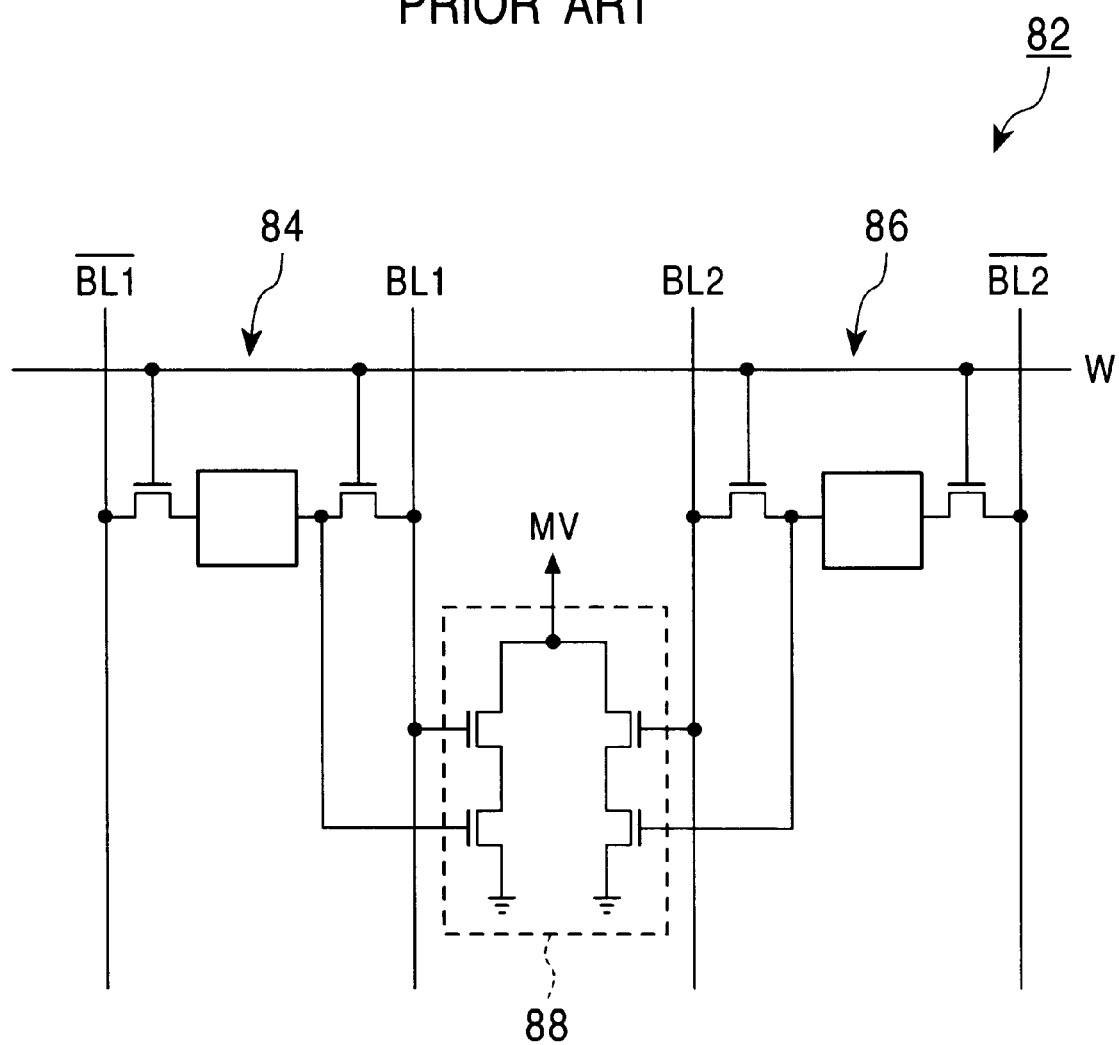
FIG. 9 illustrates another conventional ternary CAM cell unit.

FIG. 7 illustrates the embodiment of the CAM cell of the present invention.

As shown, a CAM cell unit 68 is different from the CAM cell unit 44 shown in FIG. 4 in that a pair of data bit lines BIT and BITN are connected to each of a data cell 46 and a data cell 48, that a word line WL1 is connected to the data cell 46, and that a word line WL2 is connected to the data cell 48. Like components are designated with like reference numerals.

A write driver (not shown) of the CAM cell unit 68 shown in FIG. 7 may be the write driver 62 shown in FIG. 6. In this case, the pair of data lines DL and DLN correspond to the pair of data bit lines BIT and BITN. Furthermore, the write circuit does not need the selection signal lines D1SEL and D2SEL, the column gates COL1 and COL2, and the precharge circuits S and T. The relationship between the setting in the two data cells 46 and 48 and the ternary CAM states of "0", "1", and "don't care" listed in table shown in FIG. 5 is used.

The operation of the CAM cell unit 68 of the present invention is described below with reference to FIG. 7.

To write binary data, for example, "0", a write circuit (not shown) supplies the pair of data bit lines BIT and BITN with "0,1", and conversely, to write "1", the write circuit supplies the pair of data bit lines BIT and BITN with "1,0".

The word lines WL1 and WL2 are concurrently driven to "1", and the data fed to the pair of data bit lines BIT and BITN is concurrently written to the data cells 46 and 48. When the "0" is written, "0,0" are set to the data cells 46 and 48. When the "1" is written, "1,1" are set to the data cells 46 and 48.

The CAM cell unit 68 in this setting maintains the precharged state at the match line ML when the search data matching the data stored as the DATA 1 is input, or discharges the match line ML to a ground potential through the comparator 50 when the search data unmatching the data stored as the DATA 1 is input. When the CAM cell unit 68 of this embodiment is used as a binary CAM cell unit, a single write cycle permits the CAM cell unit 68 to be used as a conventional binary CAM cell unit.

To write ternary data, one of the word lines WL1 and WL2 is set to "1". The data fed to the pair of data bit lines BIT and BITN is respectively written to the data cells 46 and 48.

The CAM cell units of the present invention have been discussed.

The present invention is not limited to the above embodiments. A variety of modifications and changes are possible without departing from the scope of the invention. In the above embodiments, a pair of data bit lines are used for an SRAM type memory cell. The present invention may be applied to a CAM cell unit that employs a DRAM type memory cell.

When the ternary CAM cell unit is used as a binary CAM cell unit, a single write cycle permits the ternary CAM cell unit to work as a conventional binary CAM cell unit without the need for increasing the area of a CAM cell, in other words, without the need for increasing a circuit scale.

What is claimed is:

1. A content addressable memory device comprising:
at least one ternary content addressable memory cell unit which stores one of the ternary data expressed by "0", "1", and "don't care" states, wherein the ternary content addressable memory cell unit comprises:
a data cell for storing a bit of binary data,
a mask cell for storing mask data that masks the bit of binary data from a searching operation,
a data bit line to which data to be written to the data cell is applied,
a mask bit line to which data to be written to the mask cell is applied,
a search data line to which search data is applied,
a word line which is commonly connected to the data cell and the mask cell,
a match line for outputting a match/unmatch result between the data stored in the data cell and the search data, and
a comparator which compares the data stored in the data cell with the search data, and outputs the result of the comparison if the mask data in the unmask state is stored in the mask cell, and outputs a match as the result of the comparison if the mask data in a mask state is stored in the mask cell; and
a write circuit which writes the bit of binary data to the data cell while writing the mask data in an unmask state to the mask cell at the same time when the binary data is written to the ternary content addressable memory cell unit.

2. A content addressable memory device according to claim 1, wherein the write circuit comprises a first write driver which supplies the data bit line with the data to be written into the data cell, and a second write driver which supplies the mask bit line with the mask data to be written into the mask cell.

3. A content addressable memory device according to claim 2, wherein the second write driver writes "0" into the mask cell regardless of the data written to the data cell when the binary data is written to the ternary content addressable memory cell unit in response to a signal that represents whether to write the binary data or ternary data to the ternary content addressable memory cell unit.

4. A content addressable memory device according to claim 3, wherein the ternary content addressable memory cell unit stores the same data to the data cell and the mask cell by selecting the word line commonly connected to the data cell and the mask cell.

5. A content addressable memory device according to claim 4, wherein each of the data cell and the mask cell is of a static random-access memory type, and wherein each of the data bit line, the mask bit line, and the search bit line is a complementary bit line pair.

6. A content addressable memory device according to claim 5, wherein the comparator receives data and the inverted data thereof from the data cell, inverted mask data from the mask cell, search data and the inverted search data thereof, and supplies the match line with the output of the comparator.

7. A content addressable memory device according to claim 6, wherein the comparator comprises:
a MOS transistor which is connected between the match line and a first node, and receives the inverted mask data at the gate thereof,
two MOS transistors which are connected in series between the first node and the ground, and receive the data from the data cell at one gate thereof and the inverted search data at the other gate thereof, and
two MOS transistors which are connected in series between the first node and the ground, and receive, at one gate thereof, the inverted data from the data cell and the search data at the other gate thereof.

8. A content addressable memory device according to claim 6, wherein the comparator comprises:
two MOS transistors which are connected in series between the search data line and the inverted search data line and receive, at one gate thereof, the data from the data cell, and the inverted data from the data cell at the other gate thereof, and
two MOS transistors which are connected in series between the match line and the ground and receive the inverted mask data at one gate thereof and with the other gate thereof connected to a node which is a connection node of the first two MOS transistors.

9. A content addressable memory device according to claim 2, wherein the second write driver writes "1" on the mask cell regardless of the data written to the data cell when the binary data is written to the ternary content addressable memory cell unit in response to a signal that represents whether to write the binary data or ternary data to the ternary content addressable memory cell unit.

10. A content addressable memory device comprising:
at least one ternary content addressable memory cell unit for storing ternary data, wherein the ternary content addressable memory cell unit comprises a first data cell for storing first data, and a second data cell for storing second data;
a comparator which compares ternary data of "1", "0", and "don't care", assigned to the first and second data, with input search data, and outputs the result of the comparison if the ternary data is "1" or "0", or always outputs a match if the ternary data is "don't care", wherein the ternary data of one of "0" and "1" is assigned to the first and second data of "0,0", the ternary data of the other of "0" and "1" is assigned to the first and second data of "1,1", and the ternary data of "don't care" is assigned to one of the first and second data of "0,1" and "1,0"; and
a write circuit which writes the same data into the first data cell and the second data cell when binary data is written into the ternary content addressable memory cell unit.

11. A content addressable memory device according to claim 10, wherein the ternary content addressable memory cell unit further comprises a first data bit line which is connected to the first data cell, and is supplied with the first data to be stored in the first data cell, a second data bit line which is connected to the second data cell and is supplied with the second data to be stored in the second data cell, and a word line which is connected to the first data cell and the second data cell, and concurrently selects the first and second data cells.

12. A content addressable memory device according to claim 11, wherein each of the first data cell and the second data cell is of a static random-access memory type, and wherein each of the first data bit line and the second data bit line is a complementary bit line pair.

13. A content addressable memory device according to claim 12, wherein the write circuit comprises:
a write driver for supplying data,
a first column gate which supplies the first data bit line pair with the data supplied by the write driver as the first data in response to a first selection signal, and
a second column gate which supplies the second data bit line pair with the data supplied by the write driver as the second data in response to a second selection signal.

14. A content addressable memory device according to claim 13, wherein when binary data is written, both the first selection signal and the second selection signal are selected so that the same data is concurrently written on the first data bit line pair and the second data bit line pair;

when ternary data is written, one of the first selection signal and the second selection signal is selected so that one of the data bit line pairs is supplied with the data supplied by the write driver, and so that the other of the data bit line pairs is supplied with a voltage equal to "1" from a precharge circuit for write inhibition;

thereafter, the other of the first selection signal and the second selection signal is selected so that the other of the data bit line pairs is supplied with the data supplied by the write driver, and so that the one of the data bit line pairs is supplied with a voltage equal to "1" from the precharge circuit for write inhibition.

15. A content addressable memory device according to claim 10, wherein when the ternary data is written on the ternary content addressable memory cell unit, the second data is written to the second data cell independently of the writing of the first data to the first data cell.

16. A content addressable memory device according to claim 15, wherein the ternary content addressable memory cell unit further comprises:

a first word line, connected to the first data cell, for selecting the first data cell, a second word line, connected to the second data cell, for selecting the second data cell, and a data bit line, connected to the first data cell and the second data cell, and supplied with data to be stored in the first data cell and the second data cell.

17. A content addressable memory device according to claim 16, wherein each of the first data cell and the second data cell is of a static random-access memory type, and wherein the data bit line is a complementary bit line pair.

18. A content addressable memory device according to claim 17, wherein when binary data is written, the first word line and the second word line are concurrently selected so that the data supplied to the data bit line is concurrently written to the first data cell and the second data cell, and wherein when ternary data is written, the first word line and the second word line are selected at different timings so that the data supplied to the data bit line is separately written to the first data cell and the second data cell.

19. A content addressable memory device according to claim 18, wherein the comparator comprises:

two MOS transistors which are connected in series between a match line and the ground, and receive inverted data from the first data cell at one gate thereof, and search data at the other gate thereof, and two MOS transistors which are connected in series between the match line and the ground, and receive data from the second data cell at one gate thereof and inverted search data at the other gate thereof.

* * * * *